(12) United States Patent
Hong

(10) Patent No.: US 10,014,042 B2
(45) Date of Patent: Jul. 3, 2018

(54) SEMICONDUCTOR DEVICE

(71) Applicant: SK hynix Inc., Icheon-si, Gyeonggi-do (KR)

(72) Inventor: Yun Gi Hong, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/481,798

(22) Filed: Apr. 7, 2017

(65) Prior Publication Data

US 2018/0122441 A1    May 3, 2018

(30) Foreign Application Priority Data

Nov. 3, 2016  (KR) .................... 10-2016-0145625

(51) Int. Cl.
| | | |
|---|---|---|
| *G11C 7/22* | (2006.01) | |
| *H04L 7/00* | (2006.01) | |
| *G11C 7/10* | (2006.01) | |
| *G06F 13/42* | (2006.01) | |
| *H03L 7/081* | (2006.01) | |
| *H04L 7/033* | (2006.01) | |

(52) U.S. Cl.
CPC .......... *G11C 7/222* (2013.01); *G06F 13/4243* (2013.01); *G11C 7/1072* (2013.01); *G11C 7/1078* (2013.01); *G11C 7/1093* (2013.01); *H03L 7/0814* (2013.01); *H04L 7/0037* (2013.01); *H04L 7/0045* (2013.01); *H04L 7/033* (2013.01)

(58) Field of Classification Search
CPC ..................................................... G11C 7/222

USPC ......................................................... 365/193
See application file for complete search history.

(56) References Cited

U.S. PATENT DOCUMENTS

| | | | | |
|---|---|---|---|---|
| 2011/0085387 | A1* | 4/2011 | Lee ..................... | G06Q 30/0251 365/189.02 |
| 2011/0235446 | A1* | 9/2011 | Venkataraman .... | G06F 13/1689 365/193 |
| 2014/0286111 | A1* | 9/2014 | Jung ..................... | H03L 7/0805 365/193 |
| 2015/0213861 | A1* | 7/2015 | Lee ........................ | G11C 7/222 365/189.05 |
| 2015/0235684 | A1* | 8/2015 | Jung ..................... | G11C 7/222 365/189.05 |
| 2016/0071563 | A1* | 3/2016 | Lee ..................... | G06F 13/1689 365/189.07 |

FOREIGN PATENT DOCUMENTS

KR      1020160002503 A    1/2016

* cited by examiner

*Primary Examiner* — Min Huang
(74) *Attorney, Agent, or Firm* — William Park & Associates Ltd.

(57) ABSTRACT

A semiconductor device includes an input/output control circuit configured to generate a first driving signal and a second driving signal by shifting a latency signal in synchronization with a clock, and generating a strobe signal which toggles according to logic levels of the first driving signal and the second driving signal; and a data input/output circuit configured to latch input data in synchronization with the strobe signal, and outputting the latched input data as output data.

18 Claims, 7 Drawing Sheets

SEMICONDUCTOR DEVICE

CROSS-REFERENCE TO RELATED APPLICATION

The present application claims priority under 35 U.S.C. § 119(a) to Korean Patent Application No. 10-2016-0145625 filed on Nov. 3, 2016 in the Korean Intellectual Property Office, which is incorporated herein by reference in its entirety as though fully set forth herein.

BACKGROUND

The present invention relates generally to a semiconductor device having a strobe signal, and in particular to a semiconductor device which inputs and outputs data in synchronization with a stable toggling strobe signal.

Developments in semiconductor memory devices are focused more and more on decreasing device size and increasing operating speed. One approach to increasing speed is the so-called synchronous memory device, capable of operating in synchronization with an external clock signal.

An early example of a synchronous memory device was called the single data rate (SDR) synchronous memory device, which inputs/outputs one data element for each cycle of an externally-provided clock, through one pin, in synchronization with the rising edge of the clock.

SUMMARY

In an embodiment in accordance with the present invention, a semiconductor device may include: an input/output control circuit configured to generate a first driving signal and a second driving signal by shifting a latency signal in synchronization with a clock, and generating a strobe signal which toggles according to logic levels of the first driving signal and the second driving signal; and a data input/output circuit configured to latch input data in synchronization with the strobe signal, and outputting the latched input data as output data.

In an embodiment, a semiconductor device may include: a driving signal generation circuit configured to generate a first driving signal and a second driving signal by shifting a latency signal in synchronization with a clock, and generating a first internal clock and a second internal clock which have different phases, in response to the clock; and a strobe signal generation circuit configured to generate a strobe signal which toggles in response to the first driving signal and the second driving signal, in synchronization with the first internal clock and the second internal clock.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention.

Early examples of the SDR synchronous memory device are still insufficient to satisfy speed requirements of a modern system, and because of this, a double data rate (DDR) synchronous memory device is proposed, which adopts a scheme of processing two data elements for each cycle of a clock signal.

From each data input/output pin of the DDR synchronous memory device, two data elements are consecutively inputted/outputted in synchronization with the rising edge and the falling edge of an externally-provided clock signal. Since a bandwidth at least two times greater than that of a conventional SDR synchronous memory device may be realized without increasing the frequency of the clock, high speed operation may be achieved using a device of this type.

According to embodiments described herein, distinct advantages are achieved by generating a stable toggling strobe signal from driving signals, such that data may be inputted/outputted in synchronization with the stable strobe signal.

Figure 1:
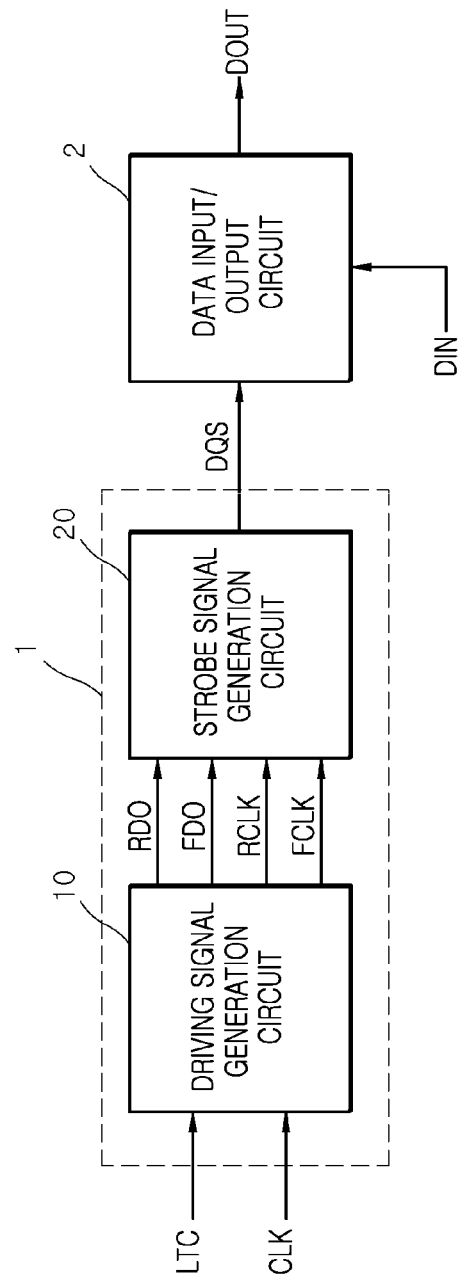
FIG. 1 is a block diagram illustrating an example configuration of a semiconductor device in an embodiment in accordance with the present invention.

As shown in FIG. 1, a semiconductor device in accordance with an embodiment may include an input/output control circuit 1 and a data input/output circuit 2. The input/output control circuit 1 may include a driving signal generation circuit 10 and a strobe signal generation circuit 20.

The driving signal generation circuit 10 may generate a first driving signal RDO and a second driving signal FDO by shifting a latency signal LTC. The driving signal generation circuit 10 may generate the first driving signal RDO and the second driving signal FDO, by shifting the latency signal LTC in synchronization with a clock CLK. The driving signal generation circuit 10 may generate a first internal clock RCLK and a second internal clock FCLK which have different phases, in response to the clock CLK. The driving signal generation circuit 10 may generate the first internal clock RCLK, which has the same phase as the clock CLK. The driving signal generation circuit 10 may also generate the second internal clock FCLK, which has a phase opposite to the clock CLK. The latency signal LTC may be a pulse generated to adjust a time at which input data DIN is outputted.

The strobe signal generation circuit 20 may generate a strobe signal DQS which toggles in response to the first driving signal RDO and the second driving signal FDO. The strobe signal generation circuit 20 may generate the strobe signal DQS which toggles according to the logic levels of the first driving signal RDO and the second driving signal FDO in synchronization with the first internal clock RCLK and the second internal clock FCLK. The logic levels of the first driving signal RDO and the second driving signal FDO for toggling the strobe signal DQS will be described in detail through a configuration to be explained later.

The input/output control circuit 1, configured as mentioned above, may generate the first driving signal RDO and the second driving signal FDO by shifting the latency signal LTC in synchronization with the clock CLK. The input/output control circuit 1 may generate the strobe signal DQS which toggles according to the logic levels of the first driving signal RDO and the second driving signal FDO.

The data input/output circuit 2 may latch the input data DIN in synchronization with the strobe signal DQS, and output the latched input data DIN as output data DOUT. The data input/output circuit 2 may latch the input data DIN which is inputted in series, align the latched input data DIN in parallel, and output the output data DOUT. While the input data DIN is illustrated as one signal, it should be noted that the input data DIN may be set as a signal including a plurality of bits. According to an embodiment, the input data DIN may be set as data stored in the semiconductor device or may be inputted from outside the semiconductor device. According to an embodiment, the output data DOUT may be stored in a memory circuit disposed in the semiconductor device or may be set to be outputted to an external device outside the semiconductor device.

Figure 2:
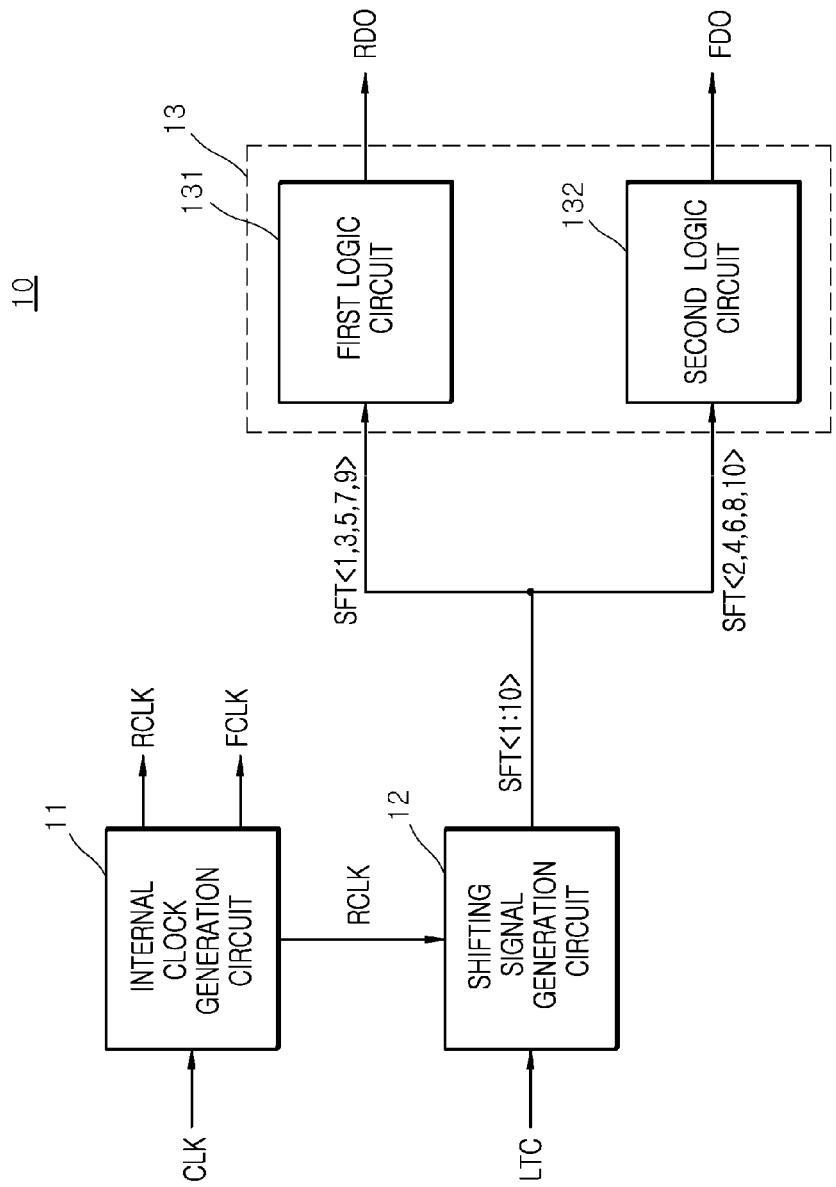
FIG. 2 is a block diagram illustrating an example configuration of the driving signal generation circuit included in the semiconductor device shown in FIG. 1.

Referring to FIG. 2, the driving signal generation circuit 10 in accordance with an embodiment may include an internal clock generation circuit 11, a shifting signal generation circuit 12, and a logic circuit 13. The logic circuit 13 may include a first logic circuit 131 and a second logic circuit 132.

The internal clock generation circuit 11 may generate the first internal clock RCLK and the second internal clock FCLK, which have different phases, in response to the clock CLK. The internal clock generation circuit 11 may generate the first internal clock RCLK which has the same phase as the clock CLK. The internal clock generation circuit 11 may generate the second internal clock FCLK which has a phase opposite to the clock CLK. The phase difference of the first internal clock RCLK and the second internal clock FCLK may be set to 180°.

The shifting signal generation circuit 12 may generate first to tenth shifting signals SFT<1:10> by shifting the latency signal LTC in synchronization with the first internal clock RCLK. The shifting signal generation circuit 12 may generate the first shifting signal SFT<1>, the third shifting signal SFT<3>, the fifth shifting signal SFT<5>, the seventh shifting signal SFT<7> and the ninth shifting signal SFT<9> by shifting the latency signal LTC in synchronization with the falling edge of the first internal clock RCLK. The shifting signal generation circuit 12 may generate the second shifting signal SFT<2>, the fourth shifting signal SFT<4>, the sixth shifting signal SFT<6>, the eighth shifting signal SFT<8> and the tenth shifting signal SFT<10> by shifting the latency signal LTC in synchronization with the rising edge of the first internal clock RCLK. An operation of generating the first to tenth shifting signals SFT<1:10> will be described in detail through a configuration to be explained later.

The first logic circuit 131 may generate the first driving signal RDO in response to the first shifting signal SFT<1>, the third shifting signal SFT<3>, the fifth shifting signal SFT<5>, the seventh shifting signal SFT<7> and the ninth shifting signal SFT<9>. The first logic circuit 131 may generate the first driving signal RDO of a logic high level (a first logic level) in the case where any one of the first shifting signal SFT<1>, the third shifting signal SFT<3>, the fifth shifting signal SFT<5>, the seventh shifting signal SFT<7> and the ninth shifting signal SFT<9> is the logic high level (the first logic level). The first logic circuit 131 may generate the first driving signal RDO by performing an OR logic function on the logic levels of the first shifting signal SFT<1>, the third shifting signal SFT<3>, the fifth shifting signal SFT<5>, the seventh shifting signal SFT<7> and the ninth shifting signal SFT<9>. The first logic circuit 131 may be realized by an OR gate.

The second logic circuit 132 may generate the second driving signal FDO in response to the second shifting signal SFT<2>, the fourth shifting signal SFT<4>, the sixth shifting signal SFT<6>, the eighth shifting signal SFT<8> and the tenth shifting signal SFT<10>. The second logic circuit 132 may generate the second driving signal FDO of a logic low level (a second logic level) in the case where any one of the second shifting signal SFT<2>, the fourth shifting signal SFT<4>, the sixth shifting signal SFT<6>, the eighth shifting signal SFT<8> and the tenth shifting signal SFT<10> is the logic high level (the first logic level). The second logic circuit 132 may generate the second driving signal FDO by performing a NOR logic function on the logic levels of the second shifting signal SFT<2>, the fourth shifting signal SFT<4>, the sixth shifting signal SFT<6>, the eighth shifting signal SFT<8> and the tenth shifting signal SFT<10>. The second logic circuit 132 may be realized by a NOR gate.

Figure 3:
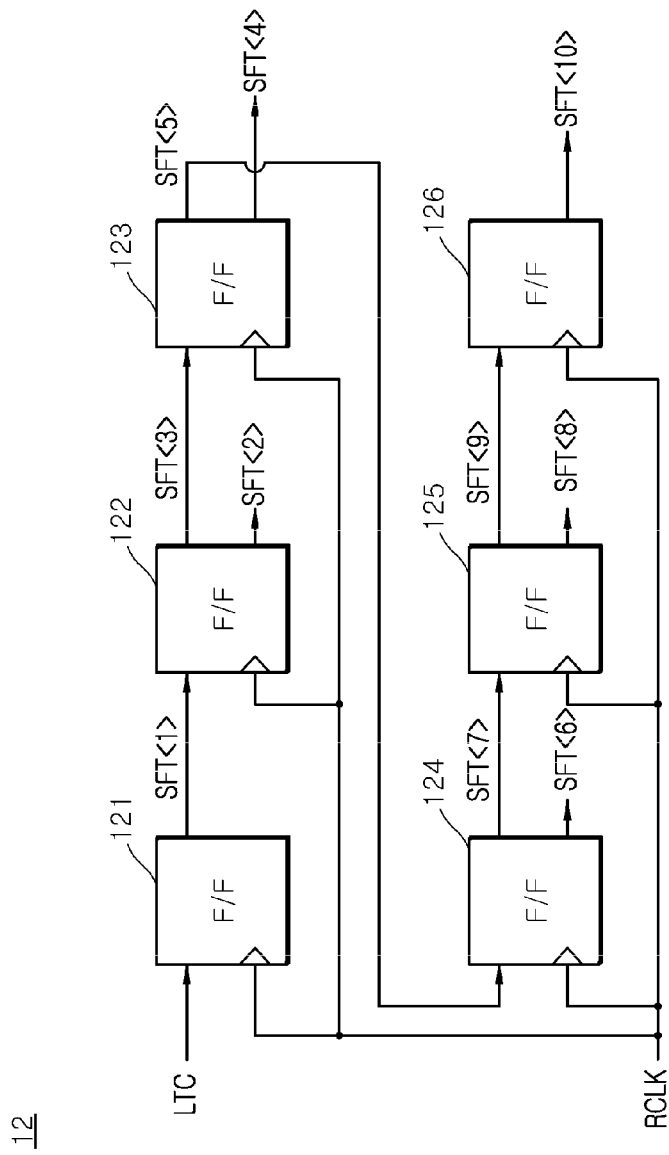
FIG. 3 is a block diagram illustrating an example configuration of the shifting signal generation circuit included in the driving signal generation circuit shown in FIG. 2.

FIG. 3 illustrates that the shifting signal generation circuit 12 may include a first flip-flop 121, a second flip-flop 122, a third flip-flop 123, a fourth flip-flop 124, a fifth flip-flop 125, and a sixth flip-flop 126.

The first flip-flop 121 may transfer the latency signal LTC as the first shifting signal SFT<1> in synchronization with the first internal clock RCLK. The first flip-flop 121 may transfer the latency signal LTC as the first shifting signal SFT<1> in the case where the first internal clock RCLK level-transitions from the logic high level to the logic low level. The first flip-flop 121 may generate the first shifting signal SFT<1> by shifting the latency signal LTC by one-half cycle of the first internal clock RCLK.

The second flip-flop 122 may transfer the first shifting signal SFT<1> as the second shifting signal SFT<2>, in synchronization with the first internal clock RCLK. The second flip-flop 122 may transfer the first shifting signal SFT<1> as the second shifting signal SFT<2> in the case where the first internal clock RCLK level-transitions from the logic low level to the logic high level. The second flip-flop 122 may generate the second shifting signal SFT<2> by shifting the first shifting signal SFT<1> by one-half cycle of the first internal clock RCLK. The second flip-flop 122 may transfer the second shifting signal SFT<2> as the third shifting signal SFT<3> in synchronization with the first internal clock RCLK. The second flip-flop 122 may transfer the second shifting signal SFT<2> as the third shifting signal SFT<3>, in the case where the first internal clock RCLK level-transitions from the logic high level to the logic low level. The second flip-flop 122 may generate the third shifting signal SFT<3> by shifting the second shifting signal SFT<2> by one-half cycle of the first internal clock RCLK.

The third flip-flop 123 may transfer the third shifting signal SFT<3> as the fourth shifting signal SFT<4>, in synchronization with the first internal clock RCLK. The third flip-flop 123 may transfer the third shifting signal SFT<3> as the fourth shifting signal SFT<4>, in the case where the first internal clock RCLK level-transitions from the logic low level to the logic high level. The third flip-flop 123 may generate the fourth shifting signal SFT<4> by shifting the third shifting signal SFT<3> by one-half cycle of the first internal clock RCLK. The third flip-flop 123 may transfer the fourth shifting signal SFT<4> as the fifth shifting signal SFT<5>, in synchronization with the first internal clock RCLK. The third flip-flop 123 may transfer the fourth shifting signal SFT<4> as the fifth shifting signal SFT<5>, in the case where the first internal clock RCLK level-transitions from the logic high level to the logic low level. The third flip-flop 123 may generate the fifth shifting signal SFT<5> by shifting the fourth shifting signal SFT<4> by one-half cycle of the first internal clock RCLK.

The fourth flip-flop 124 may transfer the fifth shifting signal SFT<5> as the sixth shifting signal SFT<6>, in synchronization with the first internal clock RCLK. The fourth flip-flop 124 may transfer the fifth shifting signal SFT<5> as the sixth shifting signal SFT<6>, in the case where the first internal clock RCLK level-transitions from the logic low level to the logic high level. The fourth flip-flop 124 may generate the sixth shifting signal SFT<6> by shifting the fifth shifting signal SFT<5> by one-half cycle of the first internal clock RCLK. The fourth flip-flop 124 may transfer the sixth shifting signal SFT<6> as the seventh shifting signal SFT<7>, in synchronization with the first internal clock RCLK. The fourth flip-flop 124 may transfer the sixth shifting signal SFT<6> as the seventh shifting signal SFT<7>, in the case where the first internal clock RCLK level-transitions from the logic high level to the logic low level. The fourth flip-flop 124 may generate the seventh shifting signal SFT<7> by shifting the sixth shifting signal SFT<6> by one-half cycle of the first internal clock RCLK.

The fifth flip-flop 125 may transfer the seventh shifting signal SFT<7> as the eighth shifting signal SFT<8>, in synchronization with the first internal clock RCLK. The fifth flip-flop 125 may transfer the seventh shifting signal SFT<7> as the eighth shifting signal SFT<8>, in the case where the first internal clock RCLK level-transitions from the logic low level to the logic high level. The fifth flip-flop 125 may generate the eighth shifting signal SFT<8> by shifting the seventh shifting signal SFT<7> by one-half cycle of the first internal clock RCLK. The fifth flip-flop 125 may transfer the eighth shifting signal SFT<8> as the ninth shifting signal SFT<9>, in synchronization with the first internal clock RCLK. The fifth flip-flop 125 may transfer the eighth shifting signal SFT<8> as the ninth shifting signal SFT<9>, in the case where the first internal clock RCLK level-transitions from the logic high level to the logic low level. The fifth flip-flop 125 may generate the ninth shifting signal SFT<9> by shifting the eighth shifting signal SFT<8> by one-half cycle of the first internal clock RCLK.

The sixth flip-flop 126 may transfer the ninth shifting signal SFT<9> as the tenth shifting signal SFT<10>, in synchronization with the first internal clock RCLK. The sixth flip-flop 126 may transfer the ninth shifting signal SFT<9> as the tenth shifting signal SFT<10>, in the case where the first internal clock RCLK level-transitions from the logic low level to the logic high level. The sixth flip-flop 126 may generate the tenth shifting signal SFT<10> by shifting the ninth shifting signal SFT<9> by one-half cycle of the first internal clock RCLK.

Figure 4:
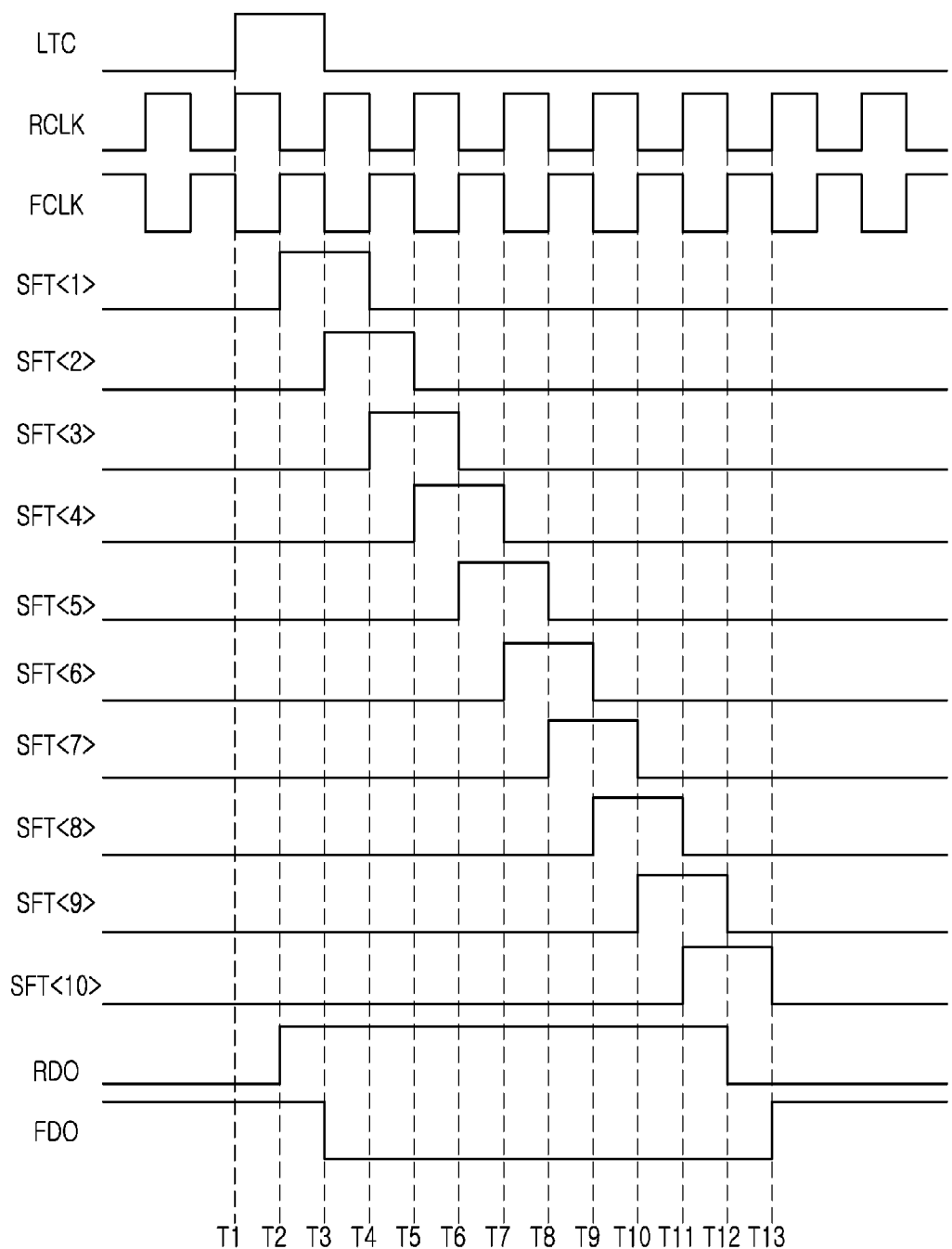
FIG. 4 is a timing diagram that aids in the explanation of operation of the driving signal generation circuit shown in FIG. 2.

The operation of the driving signal generation circuit 10 in accordance with an embodiment will be described below in detail with reference to FIG. 4.

In subsequent descriptions, it is assumed that the latency signal LTC is inputted to include a pulse generated from a time T1 to a time T3. The pulse width of the pulse included in the latency signal LTC may be set as one cycle of the first internal clock RCLK.

The internal clock generation circuit 11 generates the first internal clock RCLK which has the same phase as the clock CLK and the second internal clock FCLK which has a phase opposite to the clock CLK. The phase difference of the first internal clock RCLK and the second internal clock FCLK is set to 180°.

The first flip-flop 121 of the shifting signal generation circuit 12 shifts the latency signal LTC of the time T1 by one-half cycle of the first internal clock RCLK, and generates the first shifting signal SFT<1>, including a pulse of the logic high level at a time T2.

The second flip-flop 122 of the shifting signal generation circuit 12 shifts the first shifting signal SFT<1> of the time T2 by one-half cycle of the first internal clock RCLK, and generates the second shifting signal SFT<2>, including the pulse of the logic high level at the time T3. The second flip-flop 122 shifts the second shifting signal SFT<2> of the time T3 by one-half cycle of the first internal clock RCLK, and generates the third shifting signal SFT<3> including the pulse of the logic high level at a time T4.

The third flip-flop 123 of the shifting signal generation circuit 12 shifts the third shifting signal SFT<3> of the time T4 by one-half cycle of the first internal clock RCLK, and generates the fourth shifting signal SFT<4>, including the pulse of the logic high level at a time T5. The third flip-flop 123 shifts the fourth shifting signal SFT<4> of the time T5 by one-half cycle of the first internal clock RCLK, and generates the fifth shifting signal SFT<5>, including the pulse of the logic high level at a time T6.

The fourth flip-flop 124 of the shifting signal generation circuit 12 shifts the fifth shifting signal SFT<5> of the time T6 by one-half cycle of the first internal clock RCLK, and generates the sixth shifting signal SFT<6>, including the pulse of the logic high level at a time T7. The fourth flip-flop 124 shifts the sixth shifting signal SFT<6> of the time T7 by one-half cycle of the first internal clock RCLK, and generates the seventh shifting signal SFT<7>, including the pulse of the logic high level at a time T8.

The fifth flip-flop 125 of the shifting signal generation circuit 12 shifts the seventh shifting signal SFT<7> of the time T8 by one-half cycle of the first internal clock RCLK, and generates the eighth shifting signal SFT<8>, including the pulse of the logic high level at a time T9. The fifth flip-flop 125 shifts the eighth shifting signal SFT<8> of the time T9 by one-half cycle of the first internal clock RCLK, and generates the ninth shifting signal SFT<9>, including the pulse of the logic high level at a time T10.

The sixth flip-flop 126 of the shifting signal generation circuit 12 shifts the ninth shifting signal SFT<9> of the time T10 by one-half cycle of the first internal clock RCLK, and generates the tenth shifting signal SFT<10>, including the pulse of the logic high level at a time T11.

The first to tenth shifting signals SFT<1:10> are generated to have a pulse width the same as the pulse width of the latency signal LTC.

The first logic circuit 131 of the logic circuit 13 generates the first driving signal RDO of the logic high level (the first logic level) from the time T2 to a time T12 during which any one of the first shifting signal SFT<1>, the third shifting signal SFT<3>, the fifth shifting signal SFT<5>, the seventh shifting signal SFT<7> and the ninth shifting signal SFT<9> is the logic high level (the first logic level).

The second logic circuit 132 of the logic circuit 13 generates the second driving signal FDO of the logic low level (the second logic level) from the time T3 to a time T13 during which any one of the second shifting signal SFT<2>, the fourth shifting signal SFT<4>, the sixth shifting signal SFT<6>, the eighth shifting signal SFT<8> and the tenth shifting signal SFT<10> is the logic high level (the first logic level).

The driving signal generation circuit 10, configured as mentioned above, generates the first driving signal RDO and the second driving signal FDO, by shifting the latency signal LTC in synchronization with the clock CLK.

Figure 5:
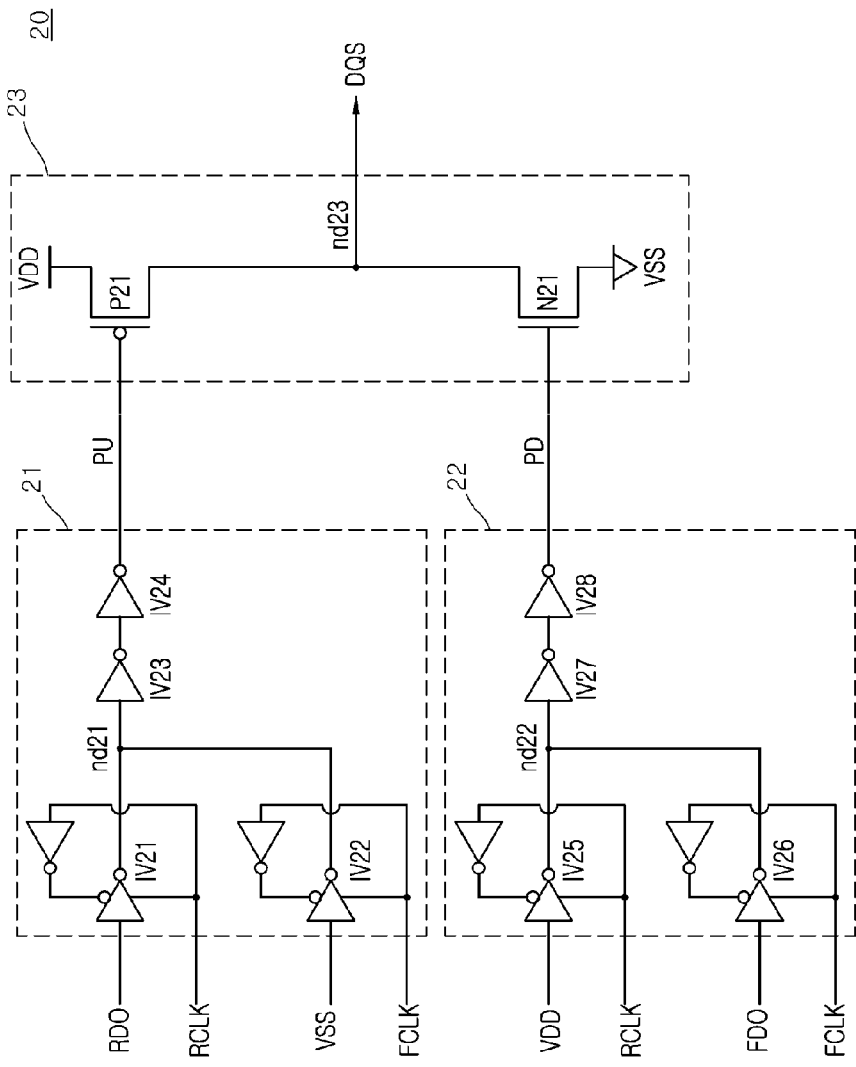
FIG. 5 is a circuit diagram illustrating the configuration of the strobe signal generation circuit included in the semiconductor device shown in FIG. 1.

Referring to FIG. 5, the strobe signal generation circuit 20, in accordance with an embodiment, may include a pull-up signal generation circuit 21, a pull-down signal generation circuit 22, and a driving circuit 23.

The pull-up signal generation circuit 21 may include a first buffer IV21, a second buffer IV22, a third buffer IV23, and a fourth buffer IV24.

The first buffer IV21 may be realized by a tri-state inverter, and may invert and buffer the first driving signal RDO in response to the first internal clock RCLK, and output a resultant signal to a first node nd21. The first buffer IV21 may invert and buffer the first driving signal RDO for a period in which the first internal clock RCLK is the logic high level, and output a resultant signal to the first node nd21.

The second buffer IV22 may be realized by a tri-state inverter, and may invert and buffer a ground voltage VSS in response to the second internal clock FCLK, and output a resultant signal to the first node nd21. The second buffer IV22 may invert and buffer the ground voltage VSS for a period in which the second internal clock FCLK is the logic high level, and output a resultant signal to the first node nd21.

The third buffer IV23 and the fourth buffer IV24 may be realized by inverters and be coupled in series, and may buffer the signal of the first node nd21 and generate a pull-up signal PU.

In this way, the pull-up signal generation circuit 21, in accordance with an embodiment, may invert and buffer the first driving signal RDO or the ground voltage VSS in synchronization with the first internal clock RCLK and the second internal clock FCLK, and may generate the pull-up signal PU.

The pull-down signal generation circuit 22 may include a fifth buffer IV25, a sixth buffer IV26, a seventh buffer IV27, and an eighth buffer IV28.

The fifth buffer IV25 may be realized by a tri-state inverter, and may invert and buffer a power supply voltage VDD in response to the first internal clock RCLK, and output a resultant signal to a second node nd22. The fifth buffer IV25 may invert and buffer the power supply voltage VDD for a period in which the first internal clock RCLK is the logic high level, and output a resultant signal to the second node nd22.

The sixth buffer IV26 may be realized by a tri-state inverter, and may invert and buffer the second driving signal FDO in response to the second internal clock FCLK, and output a resultant signal to the second node nd22. The sixth buffer IV26 may invert and buffer the second driving signal FDO for a period in which the second internal clock FCLK is the logic high level, and output a resultant signal to the second node nd22.

The seventh buffer IV27 and the eighth buffer IV28 may be realized by inverters and be coupled in series, and may buffer the signal of the second node nd22 and generate a pull-down signal PD.

In this way, the pull-down signal generation circuit 22 may invert and buffer the second driving signal FDO, or the power supply voltage VDD, in synchronization with the first internal clock RCLK and the second internal clock FCLK, and may generate the pull-down signal PD.

The driving circuit 23 may include a pull-up element P21 and a pull-down element N21. The pull-up element P21 may be realized by a PMOS transistor, which is positioned between the power supply voltage VDD and a third node nd23. In the case where the pull-up signal PU is the logic low level (the second logic level), the pull-up element P21 may be turned on, pull-up drive the third node nd23, and generate the strobe signal DQS of the logic high level (the first logic level). In the case where the pull-up signal PU is the logic high level (the first logic level), the pull-up element P21 is turned off and does not drive the third node nd23.

The pull-down element N21 may be realized by an NMOS transistor, which is positioned between the third node nd23 and the ground voltage VSS. In the case where the pull-down signal PD is the logic high level (the first logic level), the pull-down element N21 may be turned on, pull-down drive the third node nd23, and generate the strobe signal DQS of the logic low level (the second logic level). In the case where the pull-down signal PD is the logic low level (the second logic level), the pull-down element N21 is turned off and does not drive the third node nd23.

In this way, the driving circuit 23 may generate the strobe signal DQS which toggles, by driving the third node nd23 according to the logic levels of the pull-up signal PU and the pull-down signal PD.

The operation of the semiconductor device in accordance with the embodiment will be described below with reference to FIG. 6, by discussing the operations of generating the strobe signal DQS, which toggles according to the logic levels of the first driving signal RDO and the second driving signal FDO, and generating the output data DOUT by latching the input data DIN in synchronization with the strobe signal DQS.

Figure 6:
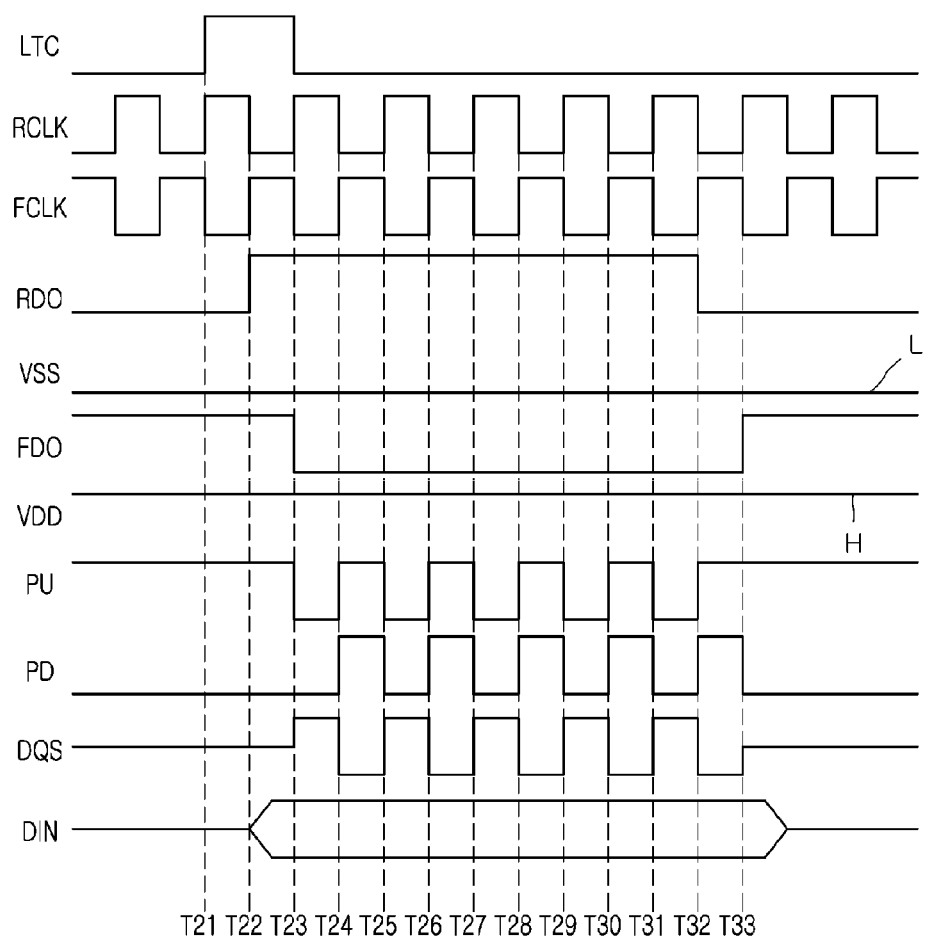
FIG. 6 is a timing diagram that aids in the explanation of the operation of the semiconductor device in an embodiment in accordance with the present invention.

In subsequent descriptions, it is assumed that times T21 to T33 shown in FIG. 6 are set to be the same as the times T1 to T13 described above with reference to FIG. 4.

The driving signal generation circuit 10 shifts the latency signal LTC of the logic high level (the first logic level) in synchronization with the clock CLK at the time T21, and generates the first driving signal RDO of the logic high level (the first logic level) from the time T22 to the time T32.

The driving signal generation circuit 10 shifts the latency signal LTC of the logic high level (the first logic level) in synchronization with the clock CLK at the time T21, and generates the second driving signal FDO of the logic low level (the second logic level) from the time T23 to the time T33.

The pull-up signal generation circuit 21 inverts and buffers the first driving signal RDO for periods T23 to T24, T25 to T26, T27 to T28, T29 to T30, and T31 to T32, in which the first internal clock RCLK is the logic high level, and generates the pull-up signal PU of the logic low level (the second logic level). The pull-up signal generation circuit 21 inverts and buffers the ground voltage VSS for periods T22 to T23, T24 to T25, T26 to T27, T28 to T29, T30 to T31, and T32 to T33, in which the second internal clock FCLK is the logic high level, and generates the pull-up signal PU of the logic high level (the first logic level). The logic level of the ground voltage VSS may be set as the logic low level (the second logic level). The second logic level means 'L' illustrated in FIG. 6.

The pull-down signal generation circuit 22 inverts and buffers the second driving signal FDO for periods T24 to T25, T26 to T27, T28 to T29, T30 to T31, and T32 to T33, in which the second internal clock FCLK is the logic high level, and generates the pull-down signal PD of the logic high level (the first logic level). The pull-down signal generation circuit 22 inverts and buffers the power supply voltage VDD for periods T23 to T24, T25 to T26, T27 to T28, T29 to T30, and T31 to T32, in which the first internal clock RCLK is the logic high level, and generates the pull-down signal PD of the logic low level (the second logic level). The logic level of the power supply voltage VDD may be set as the logic high level (the first logic level). The first logic level means 'H' illustrated in FIG. 6.

The driving circuit 23 generates the strobe signal DQS of the logic high level (the first logic level) for a period in which the pull-up signal PU is the logic low level (the second logic level), and generates the strobe signal DQS of the logic low level (the second logic level) for a period in which the pull-down signal PD is the logic high level (the first logic level). In other words, the driving circuit 23 generates the strobe signal DQS which toggles, from the time T23 to the time T33.

The data input/output circuit 2 latches the input data DIN in synchronization with the strobe signal DQS, which toggles from the time T23 to the time T33, and outputs the latched input data DIN as the output data DOUT. The period from the time T23 to the time T25 is set as a preamble period, being the stabilization period of the strobe signal DQS in which the input data DIN is not latched.

As is apparent from the above descriptions, in the semiconductor device in embodiments in accordance with the present invention, by generating a toggling strobe signal, data may be inputted/outputted in synchronization with the stable strobe signal.

Figure 7:
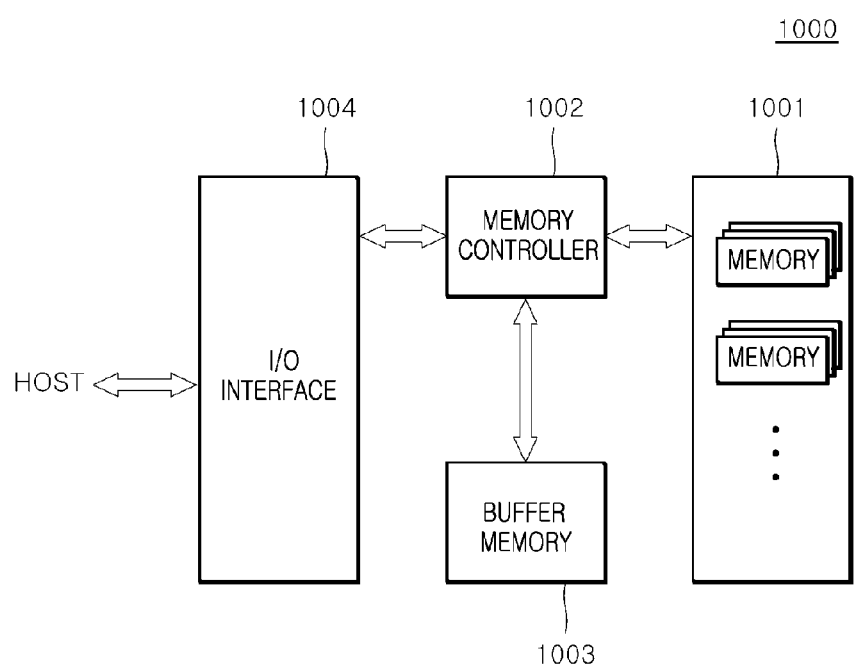
FIG. 7 is a diagram illustrating the configuration of an electronic system in which the semiconductor device shown in FIGS. 1 to 6 may be included.

The semiconductor device described above with reference to FIGS. 1 to 6 may be applied to an electronic system which includes a memory system, a graphic system, a computing system or a mobile system. For example, referring to FIG. 7, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device shown in FIG. 1. The data storage 1001 may include a nonvolatile memory, where data is continuously stored, and not lost even though the power supply may be interrupted. A nonvolatile memory may be realized as a flash memory, such as a NOR flash memory or a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 7, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow, when taken in conjunction with the above description and accompanying drawings.

What is claimed is:

1. A semiconductor device comprising:
    an input/output control circuit configured to generate a first driving signal and a second driving signal by shifting a latency signal in synchronization with a clock, and generating a strobe signal which toggles according to logic levels of the first driving signal and the second driving signal; and
    a data input/output circuit configured to latch input data in synchronization with the strobe signal, and outputting the latched input data as output data,
    wherein the input/output control circuit comprises:
    a driving signal generation circuit configured to generate the first driving signal and the second driving signal by shifting the latency signal in synchronization with the clock, and generating a first internal clock and a second internal clock which have different phases, in response to the clock; and
    a strobe signal generation circuit configured to generate the strobe signal which toggles according to the logic levels of the first driving signal and the second driving signal, in synchronization with the first internal clock and the second internal clock.

2. The semiconductor device according to claim 1, wherein the latency signal is a pulse which is generated to adjust a time at which the input data is outputted.

3. The semiconductor device according to claim 1, wherein the driving signal generation circuit comprises:

an internal clock generation circuit configured to receive the clock, generating the first internal clock which has the same phase as the clock, and generating the second internal clock which has a phase opposite to the clock;

a shifting signal generation circuit configured to generate first to fourth shifting signals by shifting the latency signal in synchronization with the first internal clock; and a logic circuit configured to generate the first driving signal according to logic levels of the first and third shifting signals, and generating the second driving signal according to logic levels of the second and fourth shifting signals.

4. The semiconductor device according to claim 3, wherein the shifting signal generation circuit comprises:

a first flip-flop configured to generate the first shifting signal by shifting the latency signal in synchronization with the first internal clock;

a second flip-flop configured to generate the second shifting signal by shifting the first shifting signal in synchronization with the first internal clock, and generating the third shifting signal by shifting the second shifting signal in synchronization with the first internal clock; and a third flip-flop configured to generate the fourth shifting signal by shifting the third shifting signal in synchronization with the first internal clock.

5. The semiconductor device according to claim 3, wherein the logic circuit comprises:

a first logic circuit configured to generate the first driving signal, which has a first logic level for a period in which a pulse of any one of the first and third shifting signals is generated, and a second logic level for a period in which pulses of the first and third shifting signals are not generated; and a second logic circuit configured to generate the second driving signal which has the second logic level for a period in which a pulse of any one of the second and fourth shifting signals is generated, and the first logic level for a period in which pulses of the second and fourth shifting signals are not generated.

6. The semiconductor device according to claim 1, wherein the strobe signal generation circuit comprises:

a pull-up signal generation circuit configured to generate a pull-up signal by buffering the first driving signal or a ground voltage in synchronization with the first and second internal clocks;

a pull-down signal generation circuit configured to generate a pull-down signal by buffering the second driving signal or a power supply voltage in synchronization with the first and second internal clocks; and a driving circuit configured to generate the strobe signal which toggles, by driving a node according to logic levels of the pull-up signal and the pull-down signal.

7. The semiconductor device according to claim 6, wherein the pull-up signal is a signal which is enabled in the case where it is generated in synchronization with a rising edge of the first internal clock for a period in which the first driving signal is the first logic level.

8. The semiconductor device according to claim 6, wherein the pull-down signal is a signal which is enabled in the case where it is generated in synchronization with a rising edge of the second internal clock for a period in which the second driving signal is the second logic level.

9. The semiconductor device according to claim 6, wherein the strobe signal is generated at the first logic level in the case where the pull-up signal is the second logic level, is generated at the second logic level in the case where the pull-down signal is the first logic level, and is a signal which does not toggle in the case where the pull-up signal is the first logic level and the pull-down signal is the second logic level.

10. A semiconductor device comprising:

a driving signal generation circuit configured to generate a first driving signal and a second driving signal by shifting a latency signal in synchronization with a clock, and generating a first internal clock and a second internal clock which have different phases, in response to the clock; and a strobe signal generation circuit configured to generate a strobe signal which toggles in response to the first driving signal and the second driving signal, in synchronization with the first internal clock and the second internal clock, wherein the driving signal generation circuit comprises:

an internal clock generation circuit configured to receive the clock, generating the first internal clock which has the same phase as the clock, and generating the second internal clock which has a phase opposite to the clock;

a shifting signal generation circuit configured to generate first to fourth shifting signals by shifting the latency signal in synchronization with the first internal clock; and a logic circuit configured to generate the first driving signal according to logic levels of the first and third shifting signals, and generating the second driving signal according to logic levels of the second and fourth shifting signals.

11. The semiconductor device according to claim 10, wherein the latency signal is a pulse which is generated to adjust a time at which input data inputted from an external device is outputted.

12. The semiconductor device according to claim 10, wherein the strobe signal is a signal which toggles according to logic levels of the first driving signal and the second driving signal.

13. The semiconductor device according to claim 10, wherein the shifting signal generation circuit comprises:

a first flip-flop configure to generate the first shifting signal by shifting the latency signal in synchronization with the first internal clock;

a second flip-flop configured to generate the second shifting signal by shifting the first shifting signal in synchronization with the first internal clock, and generating the third shifting signal by shifting the second shifting signal in synchronization with the first internal clock; and a third flip-flop configured to generate the fourth shifting signal by shifting the third shifting signal in synchronization with the first internal clock.

14. The semiconductor device according to claim 10, wherein the logic circuit comprises:

a first logic circuit configured to generate the first driving signal which has a first logic level for a period in which a pulse of any one of the first and third shifting signals is generated, and a second logic level for a period in which pulses of the first and third shifting signals are not generated; and a second logic circuit configured to generate the second driving signal which has the second logic level for a period in which a pulse of any one of the second and fourth shifting signals is generated, and the first logic level for a period in which pulses of the second and fourth shifting signals are not generated.

15. The semiconductor device according to claim 10, wherein the strobe signal generation circuit comprises:
- a pull-up signal generation circuit configured to generate a pull-up signal by buffering the first driving signal or a ground voltage in synchronization with the first and second internal clocks;
- a pull-down signal generation circuit configured to generate a pull-down signal by buffering the second driving signal or a power supply voltage in synchronization with the first and second internal clocks; and
- a driving circuit configured to generate the strobe signal which toggles, by driving a node according to logic levels of the pull-up signal and the pull-down signal.

16. The semiconductor device according to claim 15, wherein the pull-up signal is a signal which is enabled in the case where it is generated in synchronization with a rising edge of the first internal clock for a period in which the first driving signal is the first logic level.

17. The semiconductor device according to claim 15, wherein the pull-down signal is a signal which is enabled in the case where it is generated in synchronization with a rising edge of the second internal clock for a period in which the second driving signal is the second logic level.

18. The semiconductor device according to claim 15, wherein the strobe signal is generated at the first logic level in the case where the pull-up signal is the second logic level, is generated at the second logic level in the case where the pull-down signal is the first logic level, and is a signal which does not toggle in the case where the pull-up signal is the first logic level and the pull-down signal is the second logic level.

* * * * *